United States Patent [19]
Applebaum

[11] Patent Number: 5,559,373
[45] Date of Patent: Sep. 24, 1996

[54] HERMETICALLY SEALED SURFACE MOUNT DIODE PACKAGE

[75] Inventor: Edward B. Applebaum, La Habra Heights, Calif.

[73] Assignee: Solid State Devices, Inc., La Mirada, Calif.

[21] Appl. No.: 360,882

[22] Filed: Dec. 21, 1994

[51] Int. Cl.$^6$ .......................... H01L 23/10; H01L 23/48; H01L 23/52; H01L 29/40
[52] U.S. Cl. ................ 257/710; 257/735; 257/690
[58] Field of Search .......................... 257/690, 723, 257/724, 735, 710

[56] References Cited

U.S. PATENT DOCUMENTS

| | | |
|---|---|---|
| 3,119,052 | 1/1964 | Tsuji . |
| 3,422,320 | 1/1969 | Woodling . |
| 4,189,342 | 2/1980 | Kock ........................ 257/735 |
| 4,486,622 | 12/1984 | Dathe et al. . |
| 4,661,834 | 4/1987 | Varteresian et al. ............. 257/724 |
| 4,803,546 | 2/1989 | Sugimoto et al. . |
| 4,839,716 | 6/1989 | Butt . |
| 5,064,968 | 11/1991 | Kovacs et al. . |
| 5,111,277 | 5/1992 | Medeiros, III . |
| 5,144,413 | 9/1992 | Adlerstein ...................... 257/707 |
| 5,175,397 | 12/1992 | Lindberg . |
| 5,188,985 | 2/1993 | Medeiros, III et al. . |

FOREIGN PATENT DOCUMENTS 5102331  4/1993  Japan .

OTHER PUBLICATIONS

One drawing page showing two prior package designs (Figs. 1 and 2).
One drawing page showing three prior package designs (Figs. 3A–3C).

*Primary Examiner*—Sara W. Crane
*Assistant Examiner*—S. V. Clark
*Attorney, Agent, or Firm*—Loeb & Loeb LLP

[57] ABSTRACT

A hermetically sealed surface mount diode package composed of: a support member of electrically conductive material; a diode element having two mutually opposed surfaces constituting, respectively, cathode and anode contact surfaces, the element resting on the support member so that one of the surfaces is in contact with the support member; an electrical contact member for conductively contacting the other one of the surfaces of the diode member, the contact member having a frame portion which surrounds the diode and a connection portion enclosed by the frame portion and conductively connected to the other one of the surfaces; a frame member of electrical insulating material surrounding the diode and interposed between, and secured to, the support member and the frame portion to form a hermetic seal with the support member and the frame portion; and a cover plate of electrically conductive material disposed on, secured to, and forming a hermetic seal with, the frame portion, wherein the support member, the frame portion, the frame member and the cover plate form a hermetically sealed space enclosing the diode.

8 Claims, 4 Drawing Sheets

HERMETICALLY SEALED SURFACE MOUNT DIODE PACKAGE

BACKGROUND OF THE INVENTION

The present invention relates to hermetically sealed packages for power diodes.

It is the usual practice to market semiconductor power diodes in packages which hermetically isolate the diode from the environment and provide mechanical protection for the diode. Since the price at which such components must be sold depends on the cost of the package and the labor required to fabricate the package, there is a continuing demand for reduction of these costs.

Diode of the type here under consideration, such as planar diodes, mesa diodes, diffused junction diodes, etc., have in common that they have two mutually opposed surfaces constituting, respectively, cathode and anode contact surfaces. Packages for such diodes generally include a base plate, or support member, supporting one diode surface, an insulating frame member made, for example, of ceramic, resting upon the base plate and surrounding the diode, and a cover plate resting upon the frame member and covering the diode. The base plate, the frame member and the cover plate are bonded or cemented together to form a hermetically sealed space enclosing the diode.

Typically, the base plate and the top plate are made of electrically conducting material, one surface of the diode is in electrical contact with the base plate, and the other surface of the diode is connected to the top plate by a connecting element of one type or another.

Connecting elements which have been employed in the prior art include conductive members having a C or S shape and interposed directly between the diode and the top plate. The connection provided by such contact elements has been found to present reliability problems.

Another type of connecting element which has been proposed is constituted by a solid block, or slug, of conductive material interposed between the diode and the top plate. While this eliminates some of the reliability problems posed by older connecting elements, it presents problems associated with creation of the desired hermetic seal in the space containing the diode and mechanical stresses on the diode.

Another connection technique which has been suggested involves the use of a wire bond between the diode and a conductive body connected to the top plate. While this approach solved problems presented by the earlier approaches, the resulting package is costly to manufacture and the wire bonds limited the amount of current which could be carried by the diode.

SUMMARY OF THE INVENTION

It is a primary object of the present invention to provide novel diode packages which eliminate or significantly reduce the problems presented by known packages, and particularly packages of the type described above.

Another object of the invention is to provide a diode package which employs inexpensive components that can be assembled quickly and thus economically.

Another object of the invention is to provide a diode package which can be assembled with a high degree of reliability and protects the diode against mechanical stresses, even if subjected to extreme temperature variations.

The above and other objects are achieved, according to the present invention, by a hermetically sealed surface mount diode package comprising:

a support member of electrically conductive material;

a diode element having two mutually opposed surfaces constituting, respectively, cathode and anode contact surfaces, the element resting on the support member so that one of the surfaces is in contact with the support member;

an electrical contact member for conductively contacting the other one of the surfaces of the diode member, the contact member having a frame portion which surrounds the diode and a connection portion enclosed by the frame portion and conductively connected to the other one of the surfaces;

a frame member of electrical insulating material surrounding the diode and interposed between, and secured to, the support member and the frame portion to form a hermetic seal with the support member and the frame portion; and a cover plate of electrically conductive material disposed on, secured to, and forming a hermetic seal with, the frame portion, wherein the support member, the frame portion, the frame member and the cover plate form a hermetically sealed space enclosing the diode.

Because the connection portion of the contact member forms a unit with the frame portion, it is a simple matter to accurately position the connection portion relative to the associated diode surface. The connection portion can be dimensioned to cover the entire associated diode surface, thereby maximizing current carrying capability. The electrical contact member can be constructed to accommodate significant thermal expansion differentials between the contact member and the diode without imposing any resulting mechanical stresses on the diode. As a result, a package according to the present invention combines ease and reliability of assembly with high operating reliability and long useful life.

DESCRIPTION OF THE PREFERRED EMBODIMENTS

Figure 2A:
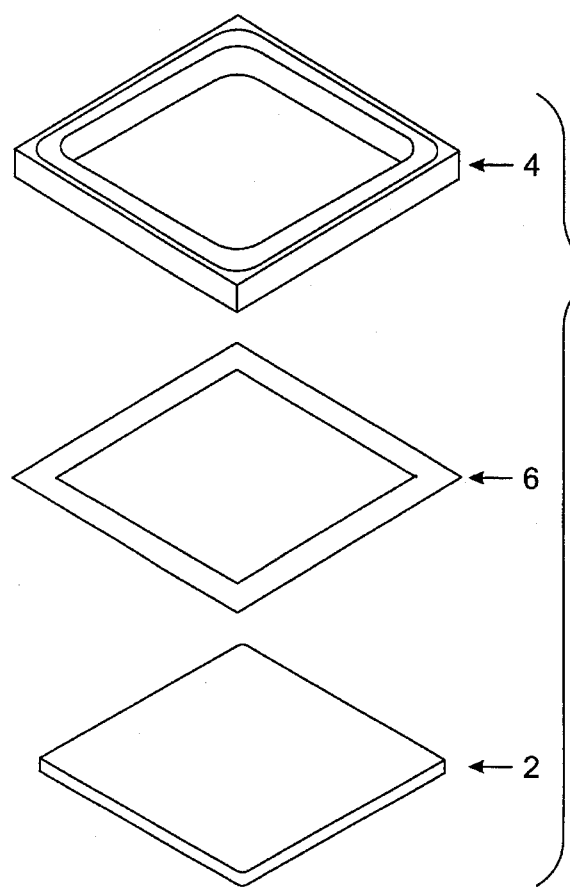
FIGS. 2a, 3a, and 4a are exploded perspective views of various portions of the diode package of FIG. 1.
Figure 2B:
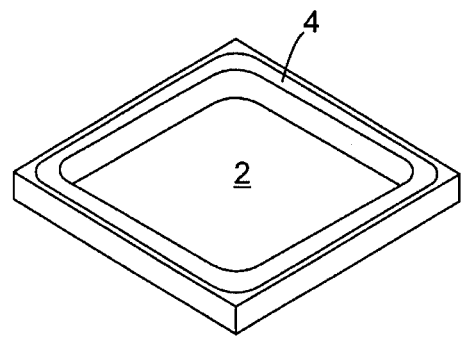
FIGS. 2b, 3b and 4b are perspective views of the diode package of FIG. 1 at various stages of assembly.
Figure 3A:
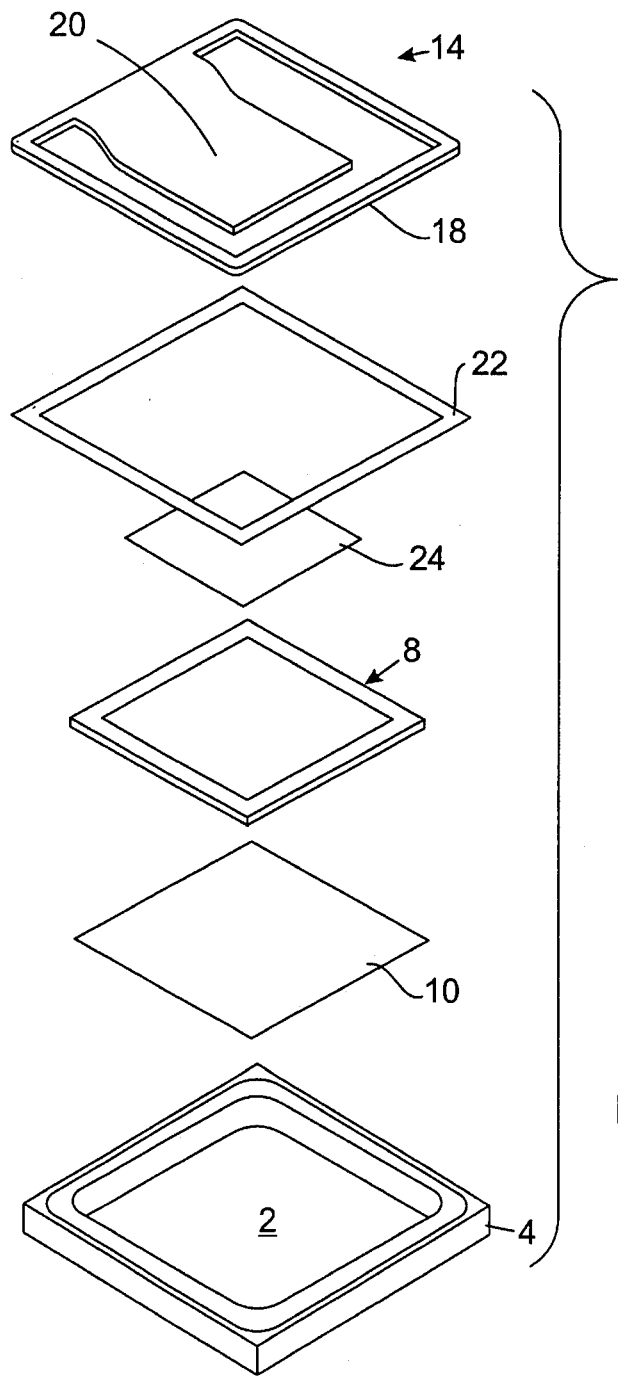
Figure 3B:
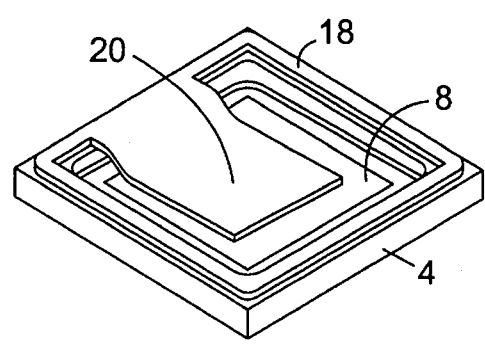
Figure 4A:
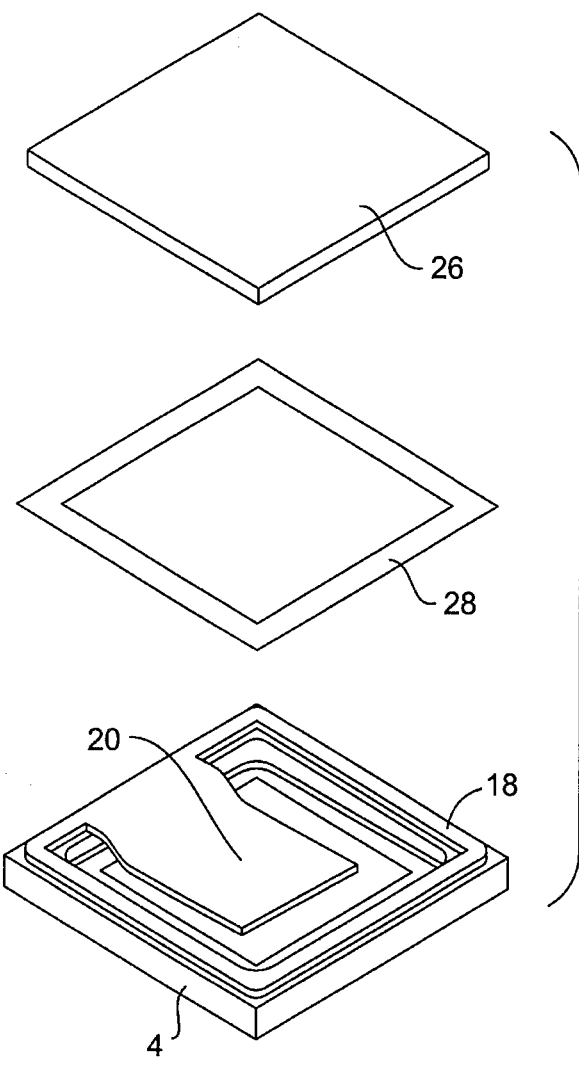
Figure 4B:
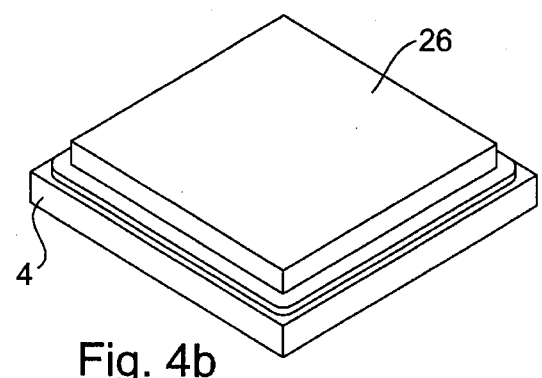

In the following description, reference will be made to FIG. 1 and FIGS. 2a–4b simultaneously since they both illustrate, in different forms, the same embodiment of the invention. It will be noted that, in FIG. 1, the thickness of many of the components has been exaggerated for ease of illustration. FIGS. 2a–4b show the relative dimensions of the various components more accurately. FIGS. 2b, 3b and 4b show the assembled states of the components shown in FIGS. 2a, 3a and 4a, respectively.

The preferred embodiment of the invention includes a base plate, or support member, 2 made, for example, of CuMo, brazed to a frame member 4 made, for example, of a ceramic material such as $Al_2O_3$. In the illustrated embodiment, frame member 4 has a square form, although other forms are possible. Brazing is achieved with a brazing layer which is initially provided in the form of a brazing preform 6 made, for example, of a CuAg alloy. Preform 6 is in the form of a frame having an outer periphery at least approximately corresponding to that of base plate 2 and an inner periphery at least approximately corresponding to the inner periphery of frame member 4.

A semiconductor power diode 8 is installed within frame member 4 and has its bottom surface, typically constituting its cathode, secured to base plate 2 with the aid of a hard solder layer, for example made of an AuSn alloy, initially in the form of a preform 10 made of a material which forms a hard solder joint between diode 8 and base plate 2.

A one-piece contact member 14 composed of a frame portion 18 and a connection portion 20 is disposed atop frame member 4 and diode 8. Frame portion 18 is bonded to the upper surface of frame member 4 by means of a eutectic solder layer, while connection portion 20 is bonded to the anode surface of diode 8 by a eutectic solder layer. The eutectic solder layers may be made of an AuSn alloy or an AuGe alloy, for example, and are initially provided in the form of preforms 22 and 24, preform 22 having a frame shape.

Finally, a top plate 26 is bonded to frame portion 18 via a hard solder layer initially provided in the form of a frame-shaped preform 28. Top plate 26 may be made of a CuMo alloy, and hard solder layer provided by preform 28 may be an AuSn alloy.

The resulting package forms a hermetically sealed space enclosing diode 8, with plates 2 and 26 being available as external contacts.

Figure 1:
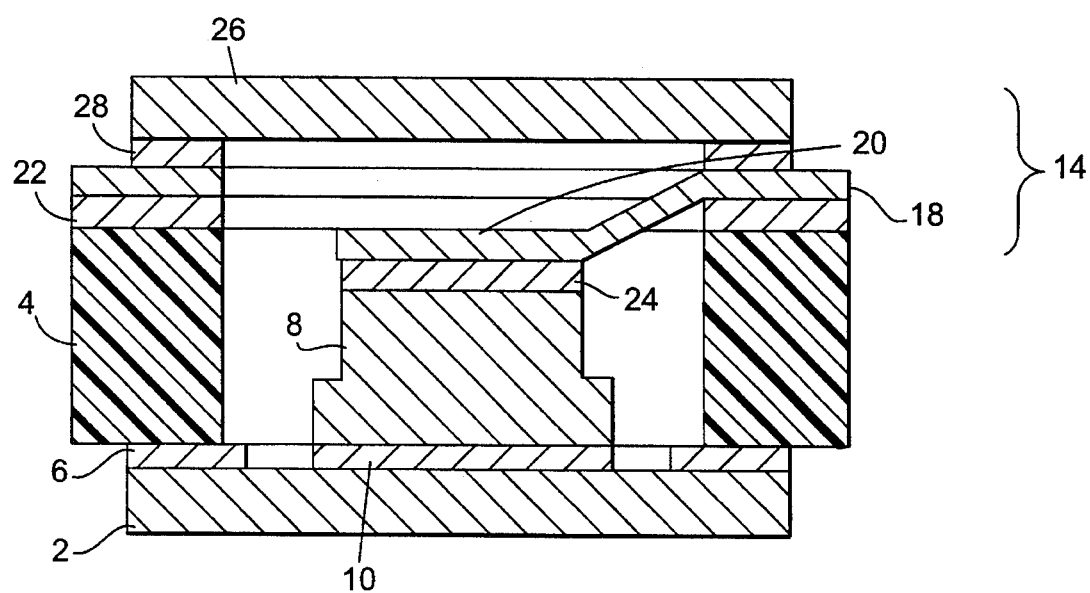
FIG. 1 is a cross-sectional elevational view of a preferred embodiment of a diode package according to the invention.

To assemble the package illustrated in FIG. 1, the various solder and brazing preforms 6, 10, 22, 24 and 28 are placed in position between the components to be bonded together and then heated to the temperature required to effect bonding. The package components are assembled from the bottom up, starting with base plate 2. After contact member 14 has been bonded to diode 8 and frame member 4, the assembled components can be visually inspected for signs of contamination and to confirm proper positioning of diode 8 and contact member 14 before top plate 26 is attached. Because frame portion 18 corresponds in outline to frame member 4, the package can be assembled to form a hermetically sealed enclosure in a reliable manner.

As shown in the drawing, connection portion 20 forms a tongue which is secured to frame portion 18 by a bent connecting portion. As shown particularly in FIGS. 3b and 4a, connection portion 20 is joined to one side of frame portion 18. As a result of this arrangement, connection portion 20 can follow thermal expansion and contraction movements of the anode surface of diode 8 without imposing any unacceptable mechanical stresses on diode 8. Since connecting portion 20 is bonded to the anode surface of diode 8, connecting portion 20 need not be pressed against diode 8 with any mechanical connection force after bonding. Therefore, contact member 14 can be of a relatively flexible material. During assembly of the package, connection portion 20 will be mechanically pressed against the anode surface of diode 8 while layer 24 is heated to the required bonding temperature.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A hermetically sealed surface mount diode package comprising:

a support member of electrically conductive material;

a diode element having two mutually opposed surfaces constituting, respectively, cathode and anode contact surfaces, said element resting on said support member so that one of said surfaces is in contact with said support member;

an electrical contact member for conductively contacting the other one of said surfaces of said diode member, said contact member having a frame portion which surrounds said diode and a connection portion enclosed by said frame portion and conductively connected to said other one of said surfaces;

a frame member of electrical insulating material surrounding said diode and interposed between, and secured to, said support member and said frame portion to form a hermetic seal with said support member and said frame portion; and a cover plate of electrically conductive material disposed on, secured to, and forming a hermetic seal with, said frame portion, wherein said support member, said frame portion, said frame member and said cover plate form a hermetically sealed space enclosing said diode.

2. A package as defined in claim 1 wherein said frame portion extends along a closed path around said diode element.

3. A package as defined in claim 2 wherein said frame portion and said frame member have corresponding outlines.

4. A package as defined in claim 3 wherein said frame portion has a plurality of sides and said connection portion is joined to one side of said frame portion.

5. A package as defined in claim 4 further comprising a solder layer securing said frame portion to said frame member.

6. A package as defined in claim 1 wherein said frame portion and said frame member have corresponding outlines.

7. A package as defined in claim 1 wherein said frame portion has a plurality of sides and said connection portion is joined to one side of said frame portion.

8. A package as defined in claim 1 further comprising a solder layer securing said frame portion to said frame member.

* * * * *